United States Patent [19]

Knaebel

[11] 4,152,624
[45] May 1, 1979

[54] MOLDED LED INDICATOR

[75] Inventor: Vincent J. Knaebel, Palo Alto, Calif.

[73] Assignee: Monsanto Company, St. Louis, Mo.

[21] Appl. No.: 887,382

[22] Filed: Mar. 16, 1978

[51] Int. Cl.² .................. H05B 33/06; H05B 33/22
[52] U.S. Cl. ............................. 313/499; 313/512; 357/72
[58] Field of Search .............. 313/499, 512; 357/72

[56] References Cited
U.S. PATENT DOCUMENTS

| 3,764,862 | 10/1973 | Jankowski | 313/499 X |
| 3,780,357 | 12/1973 | Haitz | 313/499 X |
| 4,000,437 | 12/1976 | Lederhandler et al. | 313/500 |

Primary Examiner—Palmer C. Demeo
Attorney, Agent, or Firm—Henry Croskell

[57] ABSTRACT

An LED device of the discrete type having a rectangular light emitting area suited for being arrayed with similar devices in contiguous relationship without optical cross-talk therebetween. An opaque but diffusely reflective housing of the device is molded of synthetic resin material with rectangular integral side walls defining a rectangular body. Their interior surfaces have peripheral upper and lower edges defining a principal cavity having a rectangular top opening. A pair of spaced electrodes extend through a bottom opening and have upper portions extending up into the cavity and there terminating so as to provide an electrode surface area below the top opening having a specularly reflective LED-containing cavity formed therein. An LED die within the electrode cavity is series-connected with the electrodes. Sloped inner walls of the body provide nonspecular reflection of light emitted from the LED. The principal cavity is filled with a synthetic resin material including dispersed light scattering particles. The construction results in a uniformly illuminated light-emitting area of arrayable rectangular format nearly as large as the top of the device.

20 Claims, 9 Drawing Figures

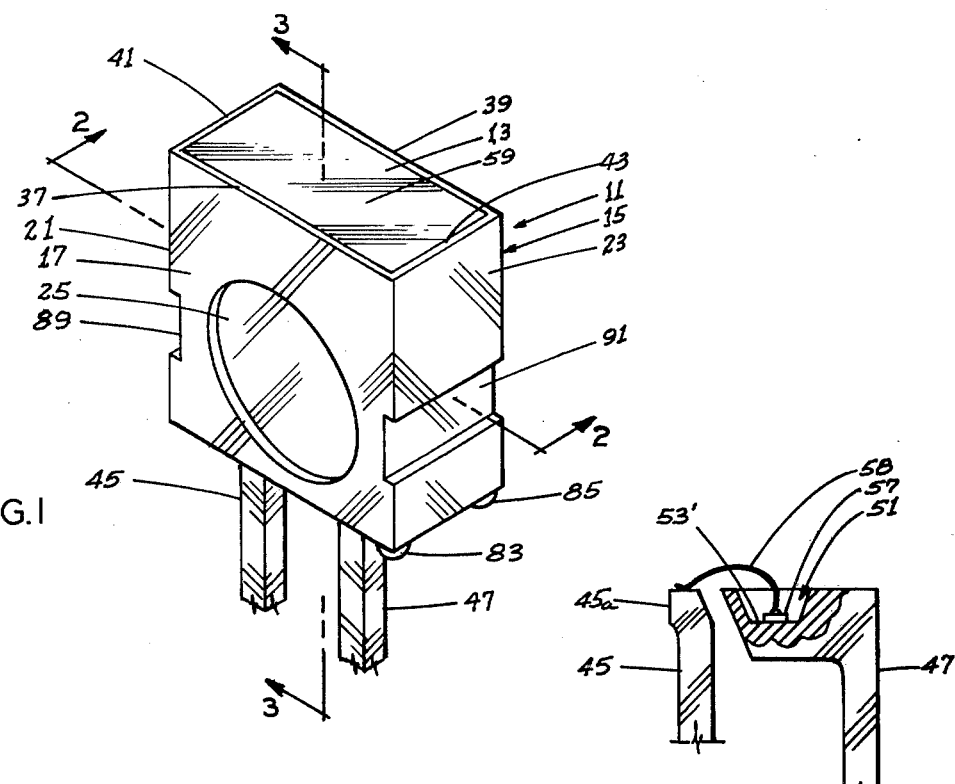
FIG. 1
FIG. 4
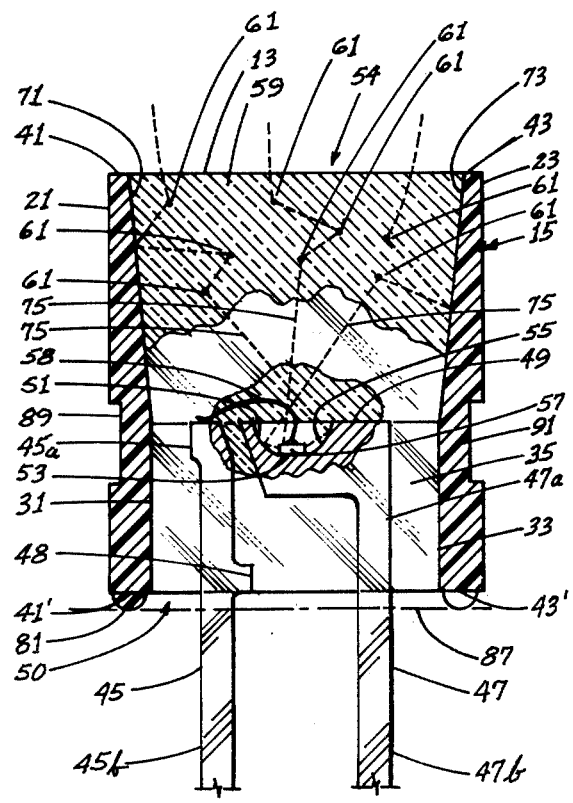
FIG. 2
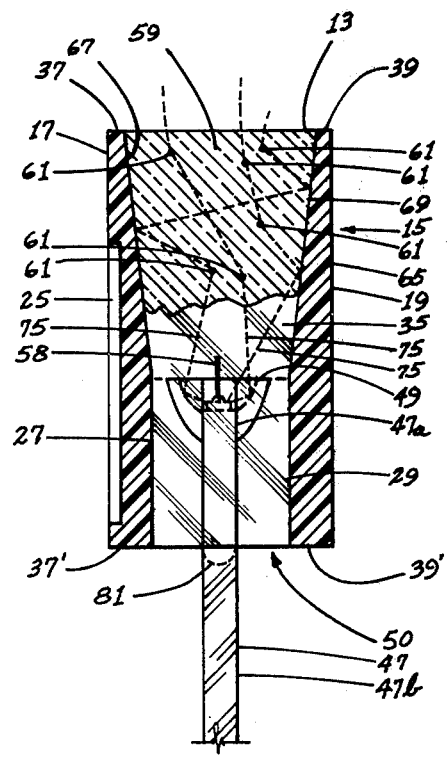
FIG. 3

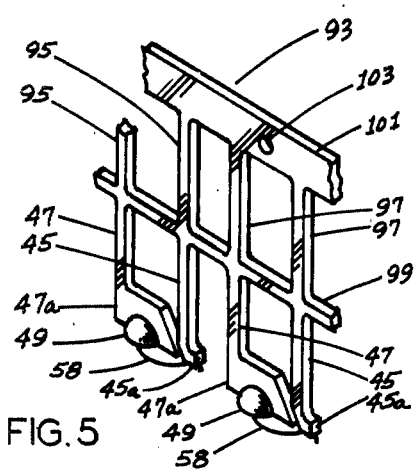
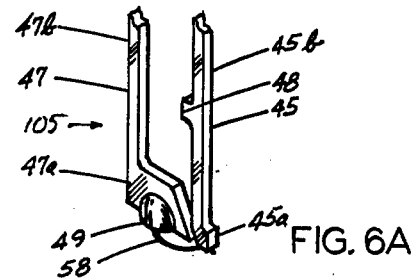
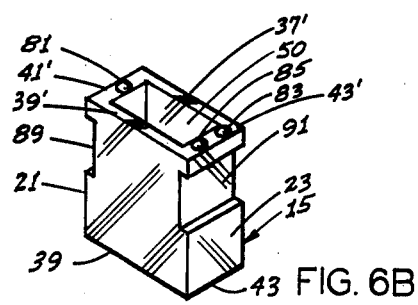
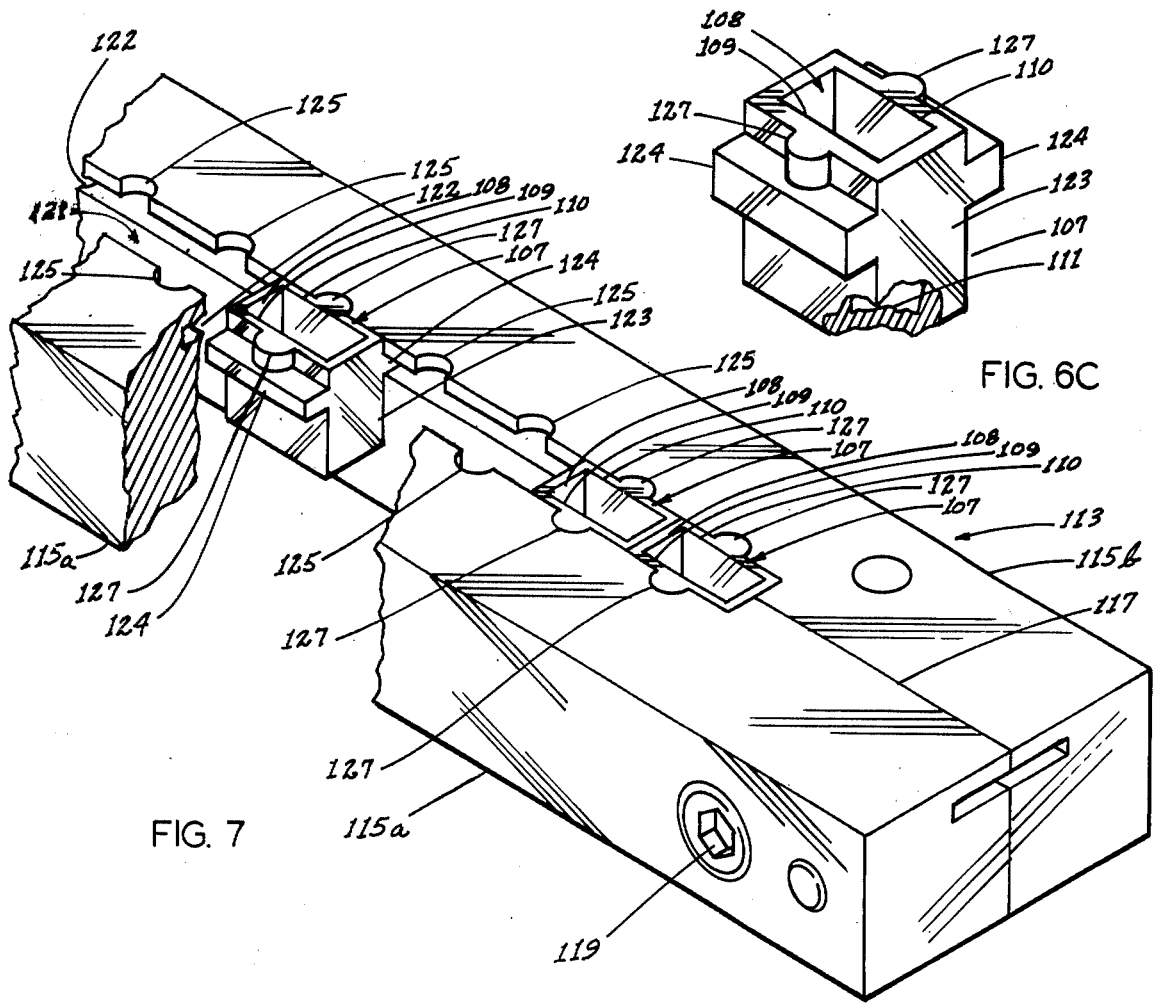

MOLDED LED INDICATOR

BACKGROUND OF THE INVENTION

This invention relates to solid state electroluminescent devices, and more particularly, such devices of a discrete light source nature employing light-emitting diodes.

In recent years, light-emitting diode (LED) devices of the type providing a discrete source of light (as compared with display devices such as commonly employed for alphabetic and numeric or so-called alphanumeric visual displays) have found increasing use as indicators, panel lights, and even as devices for illuminating or "backlighting" of objects or devices in proximity thereto, such as push buttons, meters, printed legends on electronics equipment and the like. Situations where "backlighting" is required include translucent panels, switches or other button-like actuators, equipment fascia or the like. Accordingly, such LED discrete devices have supplanted conventional incandescent light sources in many commercial applications.

As designers have found new ways to employ such discrete devices in myriad areas of technology and commercial equipment design, need has arisen for such devices having increased light emitting area and providing as well for emission of light across the entire width and height of the face of such device. Just as importantly, there has been a need for devices having a light emitting area of a geometry suitable for arraying while providing a pleasing and useful format. It is well recognized, in addition, that there is commercial desirability that such devices have greater intensity while at the same time providing for uniform emission of light across the entire face of such device.

A recent development of note has been the incorporation of LED's in linear arrays. In such arrays, individual discrete devices are closely spaced so as to provide a linear or bar-type visual display, that is, an essentially solid state bargraph meter. As will be understood, the individual devices may be successively energized or deenergized to provide a bar or column of light of variable length. Such bargraph configurations have been proposed for use as cockpit displays, for example. In such arrayed configurations, it is desirable that the illuminated lengths appear to be more or less solid and continuous in nature with relatively little spacing between adjacent light emitting areas of such device. Heretofore, it has been known to create monolithic arrays constituted by adjacent LED devices in a single substrate or crystal. Such configurations are costly and difficult to manufacture. Similar configurations can be achieved by simply placing individual discrete devices in side-by-side relationship.

In such linear arrays, as well as other arrayed configurations, it is usually desirable to prevent or minimize so-called optical cross-talk between adjacent discrete devices. Such cross-talk is manifested by light from an illuminated device being coupled into an adjacent unlighted device. The effect of such cross-talk is one of semaring or indefinite demarcation between adjacent lighted and unlighted devices. The resultant lack of contrast between the adjacent lighted and unlighted areas is generally undesirable.

Typically, LED devices of the discrete type employ one or more chips or so-called die of monocrystalline semiconductive material selected from binary, ternary or quaternary compounds of elements selected from groups III and V of the periodic table, such as Ga, In, Al, P and As. Conventionally, such die are produced by dicing a thin wafer of such a monocrystalline semiconductor, and typically comprises a first region of a first electrical conductivity type, such as n-type, and a thin further region of opposite conductivity type, such as p-type, so as to provide a p-n junction in the material providing a diode structure with an active region where light omission occurs through radiative recombinant phenomena.

Price competitive factors in the commercial marketing of LED discrete devices require that their manufacturing costs be minimized. Such considerations make it difficult to meet the objectives dictated by the foregoing criteria.

Most commercially available LED devices which emit light in the visible spectrum and which are useful for devices of the present character are of GaP and GaAsP. Such materials have different light emitting characteristics. For example, GaP characteristically has a more or less isotropic emission pattern, emitting light from the sides as well as the faces of such device due to the semitransparent nature of the crystalline material. In comparison, GaAsP devices emit light having a Lambertian emission characteristic such that light is predominently emitted in a direction which is normal to a face of such device, it being understood that the p-n junction is conventionally parallel to the light emitting face and is spaced at least several microns from the light-emitting face.

SUMMARY OF THE INVENTION

Accordingly, among the objects of the invention may be noted the provision of an improved LED indicator device of the discrete type; the provision of such a device which can be arrayed x-axis and/or y-axis directions with other such devices to provide composite light-emitting areas of various geometries, sizes or shapes, including arraying such devices in an in-line relationship to provide a superior bar-type visual display.

Other objects include the provision of such a device providing not only for emission of light substantially across the entire width and height of the device face, but also having a light-emitting area nearly as large as the top face of the device; the provision of such a device which substantially precludes optical cross-talk between contiguous devices when arrayed.

Further objects of the invention include the provision of such a device providing relatively high intensity light emissions which is substantially uniform across the entire light-emitting area or face; the provision of such a device which is easily secured to a panel or other object either individually or in arrayed configuration; the provision of such a device which effectively may utilize LED's of either isotropic or Lambertian emission characteristics; the provision of such a device which is relatively small, compact, of pleasing appearance, and which is simply and extremely economically manufactured.

Among objects of the invention may also be noted the provision of a method for making such devices in a most economical manner and the provision of such a method greatly facilitating the manufacture of various sizes of such devices through molding techniques but without requiring expensive duplication of molding machinery.

Briefly, a solid state electroluminescent indicator device of the present invention is such that it has a light emitting top area of rectangular format. Such format makes the device suitable for being arrayed with other such devices in contiguous relationship without optical cross-talk between the adjacent devices. The device includes a housing of molded synthetic resin material which is substantially opaque but diffusely reflective. The housing has four integrally joined side walls defining a generally rectangular body of the device. Each of the side walls has exterior surfaces of a generally rectangular shape, the inerior surfaces of the side walls having peripheral upper and lower edges which define a principal cavity of the device having a top and a bottom, the top being an opening of rectangular shape.

A pair of spaced electrodes, i.e., an anode and cathode, of electrically conductive material extend generally vertically through the bottom. The electrodes each have upper portions extending from the bottom into the principal cavity and terminating within the cavity. The upper ends of the electrodes provide a surface area in at least one of the electrodes which is generally parallel to but below the top opening of the device and is positioned within the cavity. Such surface area includes an integral specularly reflective LED-containing cavity formed by the material of the electrodes. The LED-containing cavity has a bottom surface facing the top opening of the device.

An LED constituted by a body of suitable semiconductor material such as a GaAsP or GaP die is positioned within the LED-containing cavity. The LED body is interconnected in series electrical circuit relationship to the electrodes, as by means of a wire bond extending from one of the electrodes to a face surface of the LED body. The lower portions of the electrodes extend below the bottom opening of the device to permit connection of a source of electrical power to them for causing the LED to emit light.

In cross section, the side walls of the housing have a thickness which increases from thin-walled portions which constitute peripheral upper edges thereof in a direction toward the bottom of the principal cavity to define sloped inner walls of the principal cavity which slope toward the LED-containing cavity. The principal cavity is filled to the upper opening with a light transmissive encapsulant of synthetic resin material. Such encapsulant includes light-scattering particles dispersed therein. The encapsulant surrounds the upper portions of the electrodes, the LED-containing cavity, and the LED. Accordingly, the opening of the principal cavity provides a light-emitting area of arrayable rectangular format which emits light of intensity which is substantially uniform across the light emitting area.

An economical method of manufacturing such devices comprises forming a conductive lead frame strip for the LED having a plurality of electrode lead pairs connected by at least one integral tie bar extending lengthwise of the lead frame strip. Each lead pair provides the two electrodes for an LED, as noted above, with one of each of the electrodes of each pair providing a surface area for an LED chip or so-called die. The method involves attaching such a die to each surface area of the lead frame, connecting each die to the respective electrodes of a lead pair. There is then provided a mold base having a plurality of adjacent mold cavities spaced along an axis. The spacing between centers of the adjacent mold cavities corresponds to the spacing between centers of the adjacent lead pairs. A mold cavity insert of synthetic resin material is then placed into respective ones of the mold cavities and the inserts are secured in the inserted position. Each insert has a cavity having an opening facing upward from the mold. The cavity of each insert is defined by walls extending downwardly from said opening into each insert toward a floor thereof. The dimensions of each insert cavity are dimensioned for receiving an indicator device housing of predetermined shape and size. The housing is premolded of the synthetic resin material and has a sleeve-like configuration defining the principal cavity for receiving an electrode pair and an encapsulant. The cavity has, as explained, an upward facing opening. The method contemplates placing the device housings in the insert cavities, moving the lead frame relative to said mold so as to locate each of said lead pairs and LED die attached thereto into the respective principal cavity of each device housing. Either before the LED pairs are inserted into their cavities or afterwards, uncured synthetic resin encapsulant material is introduced into each principal cavity. Accordingly, this encapsulates a portion of each lead pair and the LED die attached thereto. The encapsulant is then cured until such time as each device housing, the encapsulant contained therein, and the lead pair having an LED die attached thereto from an integral relationship. The lead frame is then moved relative to the mold so as to remove prefinished LED indicator devices from the mold inserts. Preferably, a curing period at an elevated temperature then follows.

Other objects and features will be apparent or pointed out below.

BRIEF DESCRIPTION OF THE DRAWINGS

FIG. 1 is a perspective view of an LED device of the present invention.

FIG. 2 is a vertical cross-section of the device taken along line 2—2 of FIG. 1.

FIG. 3 is another vertical cross-section of the device taken along the line 3—3 of FIG. 1.

FIG. 4 is a side view, partly in cross-section, of a pair of electrodes having an integral reflective cavity of an alternate form different from that shown in FIG. 2.

FIG. 5 is a pictorial view of a section of a lead frame and showing two sets of electrode pairs of such lead frame.

FIG. 6A illustrates portions of an electrode pair of such lead frame positioned for insertion into the cavity of an LED device housing of the present invention in accordance with a method disclosed herein.

FIG. 6B is a pictorial view of such device housing positioned for insertion into a mold cavity insert.

FIG. 6C is a pictorial view of such mold cavity insert, partly in cross-section, positioned for orientation in a mold.

FIG. 7 is a pictorial view, partly in cross-section, illustrating such a mold employed in carrying out a method in accordance with the present description and showing a number of such mold inserts placed in mold cavity inserts of the mold.

Corresponding reference characters indicate corresponding parts throughout the several views of the drawing.

DESCRIPTION OF THE PREFERRED EMBODIMENTS

Referring now to FIG. 1, illustrated generally at 11 is a new solid state electroluminescent device of the present invention. Although device 11 may be arrayed with similar devices in suitable composite configurations, e.g., to provide a bar-type display or other display configurations, the device may be regarded individually as a solid state indicator.

Indicator 11 has a rectangular format light emitting area 13 at the top of a housing designated generally 15. Area 13 is nearly as large as the length and width of the housing so that substantially the entire top surface of the device will appear to be illuminated.

Housing 15 is of a molded synthetic resin material described below of substantially opaque nature, i.e., will substantially preclude most, if not all, of light emitted within the interior of indicator 11 from being transmitted through its walls, it being desired that the light emerge from area 13 rather than "leaking" through the walls of housing 15. This prevents optical cross-talk between adjacent identical devices when arrayed in contiguous relationship.

For reasons more fully explained below, the resin material of housing 15 is diffusely reflective, at least as to its interior surfaces, so that light falling thereon will be scattered more or less isotropically rather than being specularly reflected.

Housing 15 is of a sleeve-like configuration having four integrally joined side walls, there being a front side wall 17, a rear side wall 19, and left and right side walls 21 and 23. Although the outside face of front wall 17 is shown to have a circular indentation or depression 25 molded in it in order to more readily visually orient the indicator for correct installation, as well as to provide a pleasing appearance and also to facilitate application of a logo or other identifying indicia, indentation 25 is optional.

Each of the side walls is preferably rectangular in shape. Although it is preferred that the width of each of side walls 21 and 23 be less than that of the front wall 17 or rear wall 19, the housing 15 or body of the present indicator is rectangular, consistent with the rectangular light emitting area 13. While the thickness or depth of the indicator housing 15 from front to back is a matter of choice, it has been found that the elongated rectangular light emitting area 13 is commercially desirable and more readily facilitates arraying of the indicators in contiguous front-to-back relationship, as for assembling bar-graph type displays.

Typically, the dimensions of the present indicator may be quite small. For example, the light emitting area may be about one-quarter inch (6.4 mm) in width and about one-eighth inch (3.8 mm) in depth, i.e., from front to rear. The height of each of the side walls may typically be about a little more than one-quarter inch (6.8 mm). Consequently, a typical device of the present invention is highly miniaturized, although larger sizes are quite feasible.

In the preferred rectangular configuration, arraying or so-called stacking of the devices in multiple configurations is possible. To facilitate molding of the housing, it may have a very slight tapering inward from bottom to top, but area 13 and its walls remain rectangular to permit arraying. Multiple configurations may be either in front-to-back relationship or in side-by-side configuration. Hence, there may be either "x-axis" or "y-axis" arraying, or both, of the present solid state indicator, permitting large composite light emitting areas to be assembled.

Referring to FIGS. 2 and 3, wherein the new solid state indicator is shown in cross-section, the side walls 17, 19, 21 and 23 and corresponding interior surfaces 27, 29, 31 and 33, have inwardly sloping portions to provide within housing 15 a principal cavity 35 limited by corresponding upper and lower edges of each side wall, such being designated 37,37'; 39,39'; 41,41'; and 43,43'. Hence the top of cavity 35 is defined by upper edges 37, 39, 41 and 43, its bottom by lower edges 37', 39', 41' and 43'.

The indicator has spaced-apart cathode and anode electrode leads 45 and 47 of electrically conductive material such as an alloy of copper, iron, nickel or other metals which may be plated with nickel, gold or other metals to prevent oxidation and improve electrical contact or facilitate soldering to the electrodes if desired. Cathode electrode 45 has a small locking or locating tab 48 at the level of the housing lower edges. Electrodes 45 and 47 extend generally vertically through the bottom opening 50 of cavity 35 and terminate within the cavity at upper ends designated 45a and 47a. The upper end 47a of the anode electrode comprises a surface area 49 and is generally parallel to and below the top opening 54 of cavity 35. Area 49 includes a small integrally formed specularly respective cavity 51 having a bottom surface 53 facing the top opening 54.

Cavity 51 may be of various different configurations. Preferably, it is shown in FIG. 2 as having semihemispheric interior wall surfaces 55 which merge with bottom surface 53, the latter being flat. Suitably secured or bonded, as through use of silver epoxy, to the flat bottom surface 53 is an LED die 57 of a generally thin flat configuration and typically rectangular shape. As will be understood, the LED die 57 is a diode structure having at least one p-n junction formed therein so as to provide light emission from electron hole recombination at the junction and in space-change regions adjacent the junction when the junction is forward biased by a source of power. For such purpose, a thin wire 58, e.g., of gold, is bonded, as by conventional thermocompression or ultrasonic welding techniques, to the top surface of cathode electrode portion 45a and extends over the lip of cavity 51 and thence contacts the LED die at the bonding point on the die. In this way, the LED is series-connected with the electrodes. The light emission characteristics and composition of the light-emitting region of the LED die 57 are discussed below.

The lower portions 45b, 47b of the electrodes extend below the bottom opening of cavity 35 as leads for permitting connection of a suitable source of electrical power, such as a d.c. current source, to cause recombinant emission of light from the LED die 57.

The LED die is surrounded by a light-transmissive encapsulant 59 of synthetic resin material which fills cavity 35.

The manner in which rays of light emanating from LED die 57 are directed toward the top opening so as to illuminate area 13 is a matter of considerable significance determined not only by the emission characteristics of the LED die, the shape and reflective characteristics of the LED-containing cavity 51, and geometric configuration and reflective characteristic of the interior surfaces of side walls 17, 19, 21 and 23, but also by encapsulant 59. These several considerations, while necessarily coacting and providing the desired synergistic result for uniformly illuminating area 13 with bright light are discussed individually in detail.

It will be understood that since encapsulant 59 entirely fills principal cavity 35, it entirely surrounds the LED structure and fills the LED-containing cavity 51. Preferably, but not necessarily, encapsulant 59 is pigmented by incorporation of a dye. For example, if the LED is red light-emitting, then the encapsulant may include a red dye.

The encapsulant has a light-scattering characteristic, constituted by light-scattering centers 61 dispersed throughout the encapsulant. Preferably, encapsulant 59 is a two-part epoxy resin constituted by a resin and a hardener, such as a cyclo-aliphatic diepoxide resin and suitable curing agent therefore. Broadly, approximately from 5 to 100% by weight of borosilicate glass in the form of particles or beads is dispersed in the encapsulant, but preferably the borosilicate glass constitutes from about 20% to about 50% by weight of the encapsulant.

In a commercially preferred embodiment the borosilicate glass is approximately 325 mesh and constitutes about 33% (about one-third) by weight of the encapsulant.

Considering now the housing 15, it is preferred to employ a premolded plastic material of a resilient or semi-resilient nature. Although it is commercially preferred to use a polycarbonate which can be injection molded, the housing may instead be of injection molded thermoplastics such as polystyrene, polyethylene, polypropylene, nylon, polychlorotrifluorethylene, polytetrafluorethylene and ABS or may be molded in other manners using various thermosetting plastics constituted of suitable synthetic resin materials. When polycarbonate is employed, it is preferred to impart white pigmentation thereof by incorporation of broadly about 8 to 12% by weight of $TiO_2$ preferably about 10 to 12%. Accordingly, a diffusively reflective and commercially attractive finish results. Accordingly, reflection off the interior surfaces of the housing walls is approximately isotropic in nature.

Those portions of the side walls of the housing adjacent the top opening of cavity such as shown at 63 in the front view cross-section and at 65 in the side view cross-section are desirably quite thin so that only a very thin lip or margin of the housing, constituted by upper edges 37, 39, 41 and 43 is apparent when the device is viewed from above.

Referring again to FIGS. 2 and 3, the interior surfaces 27, 29, 31 and 33 of the side walls have flat faced portions correspondingly designated 67, 69, 71 and 73 which slope inwardly from the respective upper edges 37, 39, 41 and 43 toward the LED-containing cavity 51. Thus, the walls in cross-section are tapered and increase in thickness from thin upper edges to a constant thickness at a point proximate the level of electrode surface area 49. The housing, as a consequence, is not only sufficiently strong to maintain structural integrity and to resist deformation or the like both before and after manufacturing a completed indicator, but also provides the desired optical qualities.

Although, as noted, the LED-containing cavity 51 is shown with semihemispheric interior side walls, the cavity may be formed as shown in FIG. 4 wherein the cavity, designated 51', has side walls 55' which form an angle with the floor 53' of the cavity, the LED die 57 being secured as previously described. It is also envisioned that a two-piece cavity for the LED die may be employed rather than one formed entirely in the surface of only one electrode. Thus, part of the cavity may be in one electrode, another part in the other electrode.

The new solid indicator device may utilize both isotropic and Lambertian emitters. Thus, a GaP LED having a generally isotropic emission characteristic may be utilized, since light rays emanating from the sides of the die are reflected off the sides of the LED-containing cavity 51 and thence upward where they may strike one of the light scattering centers 61 or one of the interior surfaces 67, 69, 71 and 73. Alternatively, an LED of GaAsP having a Lambertian emission characteristic may be employed. Thus, while some rays of light emanating from a GaAsP die may strike the sides of cavity 51, the majority of the flux is upward and strikes the light scattering centers on interior surfaces before emerging from area 13.

In this regard, it is important to recognize that both isotropic and Lambertian emitters may be employed in commercial LED devices. Thus, the active region of a red light emitting LED is usually of GaAsP, although the substrate thereof may be of GaP, GaAs, GaAsP or even Ge, but has in any event a Lambertian emission characteristic. Toward the other end of the visible spectrum, e.g., for green light emission, it is usual practice to employ an LED in which the active region is of GaP, and accordingly having an isotropic emission characteristic. The present indicator device may advantageously accommodate either type of emitter and thus can be commercially produced for emission of light of any desired color capable of being generated by an LED.

In FIGS. 2 and 3, various rays of light are shown emanating from the LED die to illustrate these various characteristics. Thus, a ray such as designated 75 may strike scattering centers 61 before emerging from area 13, while another ray such as shown at 77 may strike some of the light scattering centers 61 and thence be diffusively reflected (as indicated at 79) off an interior surface of a housing wall, and thence emerge or strike other scattering centers. The result is uniform emission of light from area 13 so that it appears to be uniformly illuminated without any unevenness or "hot spot" at its center.

In order to more readily identify which of electrode leads 45 and 47 is the cathode and which is the anode, integrally molded along lower housing edges 41' and 43' are rounded protrusions or "stand-offs" 81, 83 and 85. Protrusion 81 is centered along lower edge 41' and adjacent cathode electrode 45. Protrusions 83,85 are spaced apart along lower edge 43' at the opposite side of the device and are adjacent anode electrode 47. These protrusions all extend downward the same distance from the housing lower edge. Since there are three such protrusions spaced as shown, they provide an inherently stable spacing of the device from the surface of a printed circuit board 87 (FIG. 2) when mounted thereon, as is typically desirable for devices of such character and other circuit elements so mounted.

The new device may be mounted in other ways, for example, the upper portion may be positioned so as to extend through or be abutted against an aperture in an equipment panel, fascia, or the like so that the illuminated area 13 is visible from the front. For facilitating such installations, the housing 15 is formed with shallow channels 89 and 91 extending laterally across the width of the side walls 21 and 23, respectively. Such channels are useful for receiving a retainer clip (not shown) or other means for retaining the device in predetermined position for use as an indicator.

Referring to FIG. 5, devices of the present invention are manufactured by a method beginning with the formation of a conductive lead frame 93 of plated alloy composition as described above. Such lead frame (only a portion of which is shown) has electrode lead pairs 95,97 secured together by an integral tie bar 99 extending lengthwise of the lead frame across intermediate portions of the leads and a parallel mounting portion or main tie bar 101 of greater width than bar 99 and having one or more locating holes 103. Tie bar 99 may be sheared so as to leave only the locating tab 48 secured to each cathode lead. Such shearing operation may, but not necessarily, also sever either the cathode or anode of each lead pair from main tie bar 101 so that the LED die which is attached in the integral reflective cavity of each anode electrode may be tested without the leads being shorted by either of the bars 99 and 101. However, such electrode shearing and testing may be deferred until after the assembly of completed devices.

The specific configuration of tie bars is chosen to facilitate automated processing of lead frames in which the LED dies are inserted and bonded to such integral reflective cavities, the lead wires 58 suitably secured, and appropriate portions of tie bar 99 sheared.

FIG. 6A shows an assembled electrode lead pair assembly 105 including an LED device or die series connected with the electrodes 45 and 47 by means of wire 58. As will be understood, a plurality of such assemblies 105 remain secured to main tie bar 101.

In accordance with the presently described novel method of economically manufacturing the solid state indicators, devices are formed as an ingegral unit by inserting an LED-and-electrode assembly 105 within the cavity 50 of a device housing 15 oriented as shown in FIG. 6B, and by introducing the encapsulant 59 and curing it until it solidifies.

For this purpose, it is preferred to utilize a mold in which are inserted a plurality of mold inserts 107 each of a configuration shown in FIG. 6C. Each insert 107 has a cavity 108 having an opening 109 for receiving the device housing 15. The dimensions of the insert cavity 109 are preselected by providing spacing between walls thereof (such as that designated 110) to closely accommodate and thus telescopically receive the device housing. Such mold insert 107 has a floor 111 against which the housing's upper walls edges 37, 39, 41 and 43 abut when the housing is placed within cavity 108 when the housing is oriented in the inverted position shown in FIG. 6B.

A two-piece mold 113 for carrying out the method is shown in FIG. 7 and includes halves 115a, 115b which are adapted to be fitted together in mating relationship as shown at 117 and secured as by means of screws, such as shown at 119, which extend through a bore in mold half 115a and threaded into mold half 115b, thereby permitting the two halves to be readily disassembled.

Extending lengthwise of the mold is a longitudinal cavity or spacing 121 of cruciform cross-section having lengthwise channels 122 in each mold half, such cross-section being illustrated by the corresponding cross-section of an end face 123 of mold cavity insert 107, the latter having flanges 124 for fitting within channels 122.

Preferably spaced at intervals along cavity 121 of the mold are notches 125 for accommodating corresponding projections 127 of mold insert 107, so as to secure the latter in place longitudinally with mold 113 in longitudinally aligned relationship with the spacing between adjacent centers of the mold inserts 107 and housings 15 positioned therein corresponding relatively precisely to centers between adjacent pairs of electrode pair assemblies 105 of the lead frame.

The mold is preferably of a suitable thermally conductive, long-lasting material such as steel. The mold cavity inserts 107 are of a synthetic resin material. While various such materials may be employed, each such insert is of premolded configuration, its cavity 108 being dimensioned for receiving an indicator device housing 15 of predetermined shape and size. In this regard, it will be understood that while the dimensions of cavity 108 may be varied for receiving different sizes of device housings 15, the exterior dimensions of the mold inserts 107 remain the same so as to permit use of the same mold 113 for a class of different sizes of indicator devices.

Several inserts 107 are shown in position between the halves 115a, 116b of mold 113. After the inserts (e.g., ten in number) are so placed and secured in the mold, a device housing 15 is thereafter placed in each insert cavity 108, the floor 111 of each insert 107 then defining a closure of the principal cavity 35 of each device housing. A lead frame consisting of electrode assemblies 105 is then suitably positioned above the corresponding device housings as by means of a clamp or the like.

Mold 113 is preferably then heated to a temperature suitable for causing even flow of the encapsulant characterized above, such temperature being referred to as an encapsulation temperature and preferably approximately 90° to 100° C. In this regard, the material of which the mold inserts 107 are formed must be capable of withstanding this temperature through repeated molding operations, it being desirable to reuse the inserts many times. An ABS material is useful for these purposes, retaining dimension well to continuous temperatures of more than 150° C. Other thermoplastics may be used.

The steps are then carried out of moving the lead frame 93 relative to mold 113 to position the surface area 49 of the electrode pair (having an LED positioned in its cavity 51) within the cavity 50 of each device housing 15 to an extent shown in FIGS. 2 and 3. The location tabs 48 facilitate such positioning.

Either before or after such positioning of the electrode assemblies the encapsulant is then introduced by suitable means (such as syringes or pipettes from a common source) into each device cavity 50 in an amount sufficient to cause encapsulation of the LED die positioned therein, and preferably to fill entirely each cavity 50. It will be apparent that the floor 111 of insert 107 retains the encapsulant and thus serves to delineate the light-emitting or so-called illuminated area 13 of a device after the encapsulant hardens.

Following encapsulation, the relationship of elements is maintained for a cure period, while the mold is raised to a cure temperature of about 120°-140° C. and the encapsulant permitted to cure for at least about one hour.

At the end of the cure period, the encapsulant is sufficiently hardened that the lead frame and mold may be moved relatively away from each other, thereby withdrawing prefinished LED indicator devices 11 from the mold inserts. A post curing procedure is then desirably carried out by subjecting the prefinished devices to a post cure temperature of about 120°-140° C. for several hours to cause complete curing of the encapsulant, and the relieving of stresses and the like for high device reliability.

Finally, shearing or trimming of the main tie bar 101 from at least one electrode is carried out (if not previously effected) and the finished devices are tested for proper operation and brightness. The finished devices are then sheared totally from the tie bar 101 and suitably prepared for packaging.

As various changes could be made in the above methods and products without departing from the scope of the invention, it is intended that all matter contained in the foregoing description or shown in the accompanying drawings shall be interpreted as illustrative rather than in a limiting sense.

The specific embodiments described or shown herein are intended to be illustrative, the scope of the invention being indicated by the following claims wherein all variations within the range of equivalence are intended to be encompassed.

What is claimed is:

1. A solid state electroluminescent device comprising a housing of molded synthetic resin material which is substantially opaque and which is diffusely reflective, the housing comprising integrally joined side walls defining a body for the device, said side walls having interior surfaces having peripheral upper and lower edges defining a principal cavity having a top and a bottom, the top constituting a light-emitting opening of predetermined shape, a pair of spaced electrodes of electrically conductive material extending generally vertically through the bottom, the electrodes each having upper portions extending from the bottom into the principal cavity and terminating within the cavity at upper ends, the upper ends of the electrodes presenting an area in at least one of the electrodes below the top opening and positioned within the cavity, said area including an integral specularly reflective LED-containing cavity having a bottom surface facing said top opening, an LED having a body of semiconductor material, the LED body being positioned within the LED-containing cavity, means for interconnecting the LED body in series-connected electrical circuit relationship with the electrodes, the lower portions of the electrodes extending below the bottom opening to permit connection of a source of electrical power to the electrodes for causing the LED to emit light, the housing side walls having inner surfaces which slope toward the LED-containing cavity, the principal cavity being filled with a light transmissive encapsulant of synthetic resin material having a light-scattering characteristic, the encapsulant surrounding said upper portions of the electrodes, the LED-containing cavity, and the LED, whereby said light-emitting opening emits light of substantially uniform intensity thereacross.

2. A device as set forth in claim 1 wherein the peripheral upper edges of the side walls of said housing are constituted by a thin region of said side walls to provide said light-emitting with dimensions which are nearly as great as corresponding dimensions of the housing when viewed from above the device.

3. A device as set forth in claim 2 wherein said light-emitting opening is of rectangular shape.

4. A device as set forth in claim 1 wherein the electrodes are constituted by a spaced lead pair formed from a metal lead frame strip.

5. A device as set forth in claim 1 wherein said LED comprises a monocrystalline semiconductor material having a substantial isotropic light emission characteristic.

6. A device as set forth in claim 5 wherein said LED comprises GaP.

7. A device as set forth in claim 1 wherein said LED comprises monocrystalline semiconductor material having a substantially Lambertian light emitting characteristic.

8. A device as set forth in claim 7 wherein said LED comprises GaAsP.

9. A solid state electroluminescent device having a light-emitting top area of rectangular format which is suited for being arrayed with other such devices in contiguous relationship without optical cross-talk therebetween, the device comprising a housing of molded synthetic resin material which is substantially opaque and which is diffusely reflective, the housing having four integrally joined side walls defining a generally rectangular body for the device, each of the side walls having exterior surfaces of generally rectangular shape, the interior surfaces of the side walls having peripheral upper and lower edges defining a principal cavity having a top and a bottom, the top being an opening of rectangular shape, a pair of spaced electrodes of electrically conductive material extending generally vertically through the bottom, the electrodes each having upper portions extending from the bottom into the principal cavity and terminating within the cavity at upper ends, the upper ends of the electrodes providing a surface area in at least one of the electrodes which is generally parallel to and below the top opening and which is positioned within the cavity, the surface area including an integral specularly reflective LED-containing cavity formed by the material of the electrodes, the LED-containing cavity having a bottom surface facing said top opening, an LED having a body of semiconductor material, the LED body being positioned within the LED-containing cavity, means for interconnecting the LED body in series-connected electrical circuit relationship with the electrodes, the lower portions of the electrodes extending below the bottom opening to permit connection to a source of electrical power to the electrodes for causing the LED to emit light, the side walls of the housing having in cross section a thickness which increases from peripheral upper edges of the side walls in a direction toward the bottom of the principal cavity to define sloped inner walls of the principal cavity which slope toward the LED-containing cavity, the principal cavity being filled to the top with a light transmissive encapsulant of synthetic resin material, the encapsulant including light-scattering particles dispersed therein, the encapsulant surrounding said upper portions of the electrodes, the LED-containing cavity, and the LED, whereby the opening of the principal cavity provides a light-emitting area of arrayable rectangular format which emits light of intensity which is substantially uniform across the light-emitting area.

10. A device as set forth in claim 9 wherein the bottom of said principal cavity defined by the side walls of said housing is constituted by a bottom opening of rectangular shape, the electrodes extending through the bottom opening.

11. A device as set forth in claim 9 wherein said light-scattering characteristic is constituted by light-scattering centers dispersed in said encapsulant.

12. A device as set forth in claim 9 wherein said encapsulant comprises a transparent epoxy resin, said light-scattering centers comprising borosilicate glass.

13. A device as set forth in claim 12, said LED emitting red light, said encapsulant including a red dye, said borosilicate glass constituting from about 20% to about 50% by weight of said encapsulant.

14. A device as set forth in claim 13, said LED comprising GaAsP.

15. A device as set forth in claim 13 wherein said borosilicate glass is approximately 325 mesh and constitutes about 33% by weight of said encapsulant.

16. A device as set forth in claim 11 wherein said housing comprises a diffusely reflecting material.

17. A device as set forth in claim 11 wherein said diffusely reflecting material comprises a polycarbonate plastic having about 8 to 12% by weight of $TiO_2$ therein.

18. A device as set forth in claim 9 wherein one of said electrodes is a cathode lead for the LED and the other of said electrodes is an anode lead for the LED, the peripheral lower edge of said housing having one or more protrusions integrally formed thereon adjacent one of said electrodes, such protrusion extending downward from said lower edge and signifying which of said electrodes is the anode lead and which of the electrodes is the cathode lead, such protrusion also spacing said device from a printed circuit board or the like when a device is mounted thereon.

19. A device as set forth in claim 9 wherein there are two of said protrusions adjacent one of the electrodes and one of said protrusions adjacent the other electrode, said three protrusions each extending downward from said lower edge of the housing by the same distance to provide an inherently stable spacing of said device from a printed circuit board or the like when mounted thereon.

20. A device as set forth in claim 9 wherein two of the side walls of said housing which are opposite from each other each have a channel formed in the exterior surface thereof, said channel extending across the width of said housing, said channel being useful for receiving means for retaining said device in a predetermined position for use as an indicator.

* * * * *